United States Patent [19]

Houston et al.

[11] Patent Number: 4,553,316

[45] Date of Patent: Nov. 19, 1985

[54] SELF-ALIGNED GATE METHOD FOR MAKING MESFET SEMICONDUCTOR

[75] Inventors: Theodore W. Houston; Al F. Tasch, Jr., both of Richardson; Henry M. Darley, Plano, all of Tex.; Horng S. Fu, Sunnyvale, Calif.

[73] Assignee: Texas Instruments Incorporated, Dallas, Tex.

[21] Appl. No.: 588,630

[22] Filed: Mar. 12, 1984

Related U.S. Application Data

[62] Division of Ser. No. 334,405, Dec. 24, 1981, Pat. No. 4,455,738.

[51] Int. Cl.$^4$ .................. H01L 21/302; H01L 21/265
[52] U.S. Cl. ....................................... 29/571; 29/576 B; 29/578; 148/1.5; 357/15; 357/22; 156/643
[58] Field of Search ..................... 29/571, 576 B, 578, 29/580, 591; 148/1.5, 187, 188; 156/628, 643, 659, 657; 357/15, 22, 23

[56] References Cited

U.S. PATENT DOCUMENTS 4,209,349  6/1980  Ho et al. ........................... 148/1.5 X
4,359,816  11/1982  Abbas et al. ....................... 29/578 X

OTHER PUBLICATIONS

Ipri et al; "Submicrometer Polysilicon Gate CMOS/SOS Technology", IEEE Trans. Elec. Dev., vol. ED 27, No. 7, Jul. 1980, pp. 1275–1279.
Hunter et al; "A New Edge-Defined Approach for Submicrometer MOSFET Fabrication", IEEE Elec. Devl., vol. EDL-2, No. 1, Jan. 1981, pp. 4–6.

Primary Examiner—Brian E. Hearn
Assistant Examiner—David A. Hey
Attorney, Agent, or Firm—David V. Carlson; Douglas A. Sorensen; Robert Groover, III

[57] ABSTRACT

A MESFET is fabricated using a self-aligned gate process. This process uses a vertical (anisotropic) etch to self-align the gate and source/drain. The vertical etch, in conjunction with a two-level insulator, creates a barrier between the gate and source/drain, so that when metal is deposited and reacted, and any excess removed, the gate is selfaligned with the source/drain, and contacts to the source/drain and gate are well isolated. The alignment obtained by this process is advantageous in that series channel resistance is reduced, and a more compact structure is attained for improvement in packing density.

2 Claims, 11 Drawing Figures

SELF-ALIGNED GATE METHOD FOR MAKING MESFET SEMICONDUCTOR

This application is a division of Ser. No. 334,405, filed Dec. 24, 1981, now U.S. Pat. No. 4,455,738.

BACKGROUND OF THE INVENTION

This invention relates to methods for making semiconductor devices, and more particularly to methods for making a MESFET.

The history of integrated circuit design has been characterized by a trend to increasing circuit densities. Various technologies have been developed to stimulate this trend. For example, TTL (transistor-transistor logic) was standard in digital equipment for a long time, but has given away in many areas to n-channel MOS logic circuits because of their superiority in speed-power product, packing density, and ease of device fabrication. The MESFET is a device that offers many of the advantages of n-MOS technology without some of its disadvantages. It's application will be primarily in digital logic such as memory and microprocessor circuits, as was the transistor of TTL.

One of the problems with n-channel MOS devices is that when they are scaled down in size, the gate oxide thickness must be scaled down accordingly. This creates a problem in that it is very difficult to fabricate thin silicon oxides that are free from "pinholes". A "pinhole" in a gate oxide will create a gate-to-channel short and, therefore, a device failure. This problem can be very serious, as there can be thousands of gate oxide areas on a typical n-channel MOS memory or microprocessor.

In U.S. Pat. No. 4,202,003, Darley et al disclose a MESFET device which solves many of the problems with n-channel MOS integrated circuits. However, with the continuing trend to higher packing densities, the device disclosed in the aforementioned patent will not be suitable for future design needs. Alignment tolerances which restrict chip size must be allowed for in device design, and they also adversely affect device performance by increasing source to drain series resistance.

It is the principal object of this invention to provide an improved method for making a MESFET device which is useful in the design of high density digital logic circuits. Another object is to provide a more compact MESFET device, with low source-to-drain series resistance.

SUMMARY OF THE INVENTION

In accordance with the present invention, there is provided a method for fabricating a MESFET device which has a self-aligned gate. The method brings together a series of process steps separately well known in semiconductor fabrication, to produce an improved device having reduced series channel resistance. The device produced by this method is also very compact. A higher packing density is therefore possible, even allowing for field regions that must be adequate to insure complete isolation of each device.

The concept of the method begins with the formation of an N-type layer on a P-type semiconductor substrate. Next, an insulator layer is deposited and then vertically etched to define the gate region. The vertical walls of the dielectric over the gate region are very important. After the vertical etch, a second insulator layer is deposited. The thickness of this layer will determine the gate-to-source/drain spacing, as will be shown later. Another vertical etch is done, so that the second insulator is removed down to the first insulator, and down to the surface of the silicon substrate. The structure remaining on the silicon surface will be the first insulator surrounded by a wall of the second insulator material. The walls of the second insulator material remain because of the effective vertical thickness of the second insulator material at the vertical edge of the first insulator material before the vertical etch of the second insulator material. The wall will be the thickness of the second insulator layer. Now, the first insulator is removed. The remaining barriers are the "remnant" of the second insulator layer and are as wide as the thickness of the insulator layer when it was deposited. At this point, source and drain regions are formed. A layer of metal which forms a silicide silicon is deposited, and the structure is subjected to a sintering process to form a lower resistance silicide. Unreacted metal is removed, and the device is completed by forming of interconnects.

DETAILED DESCRIPTION OF THE DRAWINGS

Figure 1A:
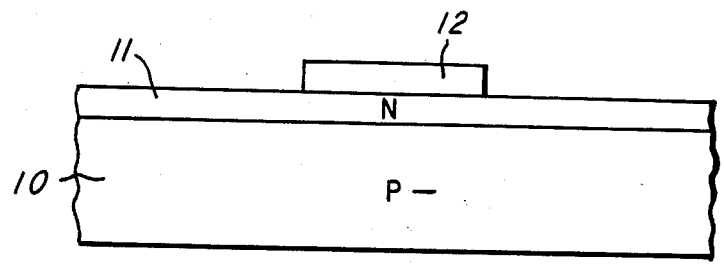
FIG. 1a–e is a series of pictorial cross-sectional views of the structure after steps in the fabrication of a MESFET by a preferred method of the present invention.
Figure 1B:
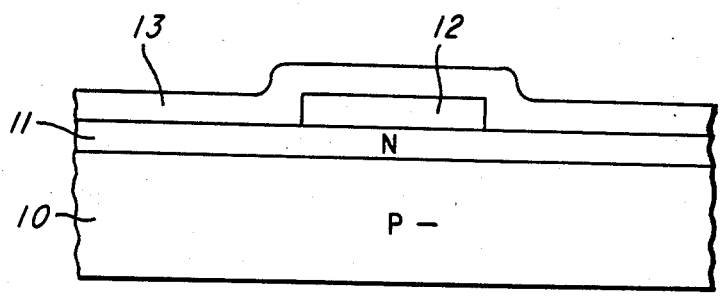
Figure 1C:
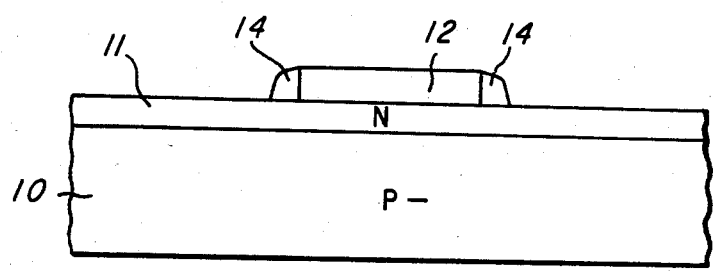
Figure 1D:
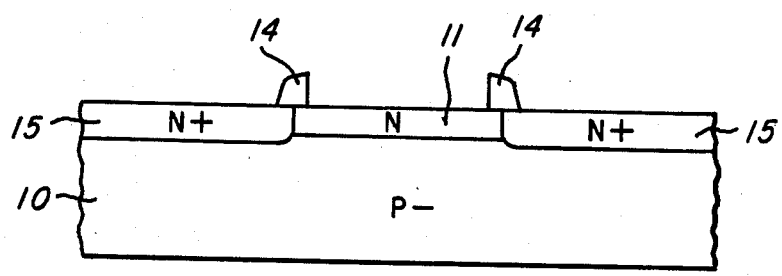
Figure 1E:
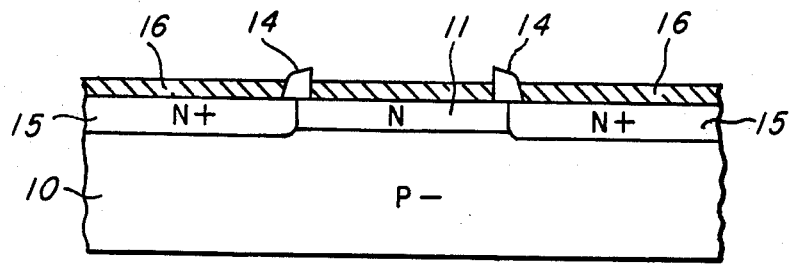

Referring to FIG. 1a, there is shown a substrate 10 of a semiconductor material such as, for example, p-type silicon. The substrate is then implanted with a dopant, for example, arsenic, to a depth of 1000 to 2500 A. The resulting N type layer (11) will form the channel of the MESFET to be subsequently formed here. Next, a layer of dielectric such as silicon nitride ($Si_3N_4$) (12) is deposited. The desired gate location is masked, and a vertical etch performed on the structure. This leaves an area of $Si_3N_4$ (12) over the gate region, and the structure is now as shown in FIG. 1a. Next, a layer of a second insulator (13) such as silicon oxide is deposited over the entire surface. As is FIG. 1b, the oxide layer (13) thickness determines eventually the spacing of the gate-source and gate-drain. The structure is now subjected to another vertical etch. The structure is now as is shown in FIG. 1c, the $Si_3N_4$ region (12) having walls (14) of silicon oxide. The next step is the removal of the $Si_3N_4$ (12). After removal, the source and drain inplants are made, and the structure appears as in FIG. 1d. The source and drain regions (15) are now in place and the gate region now defined by oxide walls (14) and aligned to the source/drain regions. The next step is to deposit a layer of platinum over the structure, and sinter it. Platinum is a preferred metal; however, any metals which form a silicide and a Schottky barrier may be used. After sintering, the platinum has reacted with the silicon substrate to form platinum silicide. Where the platinum covers the silicon oxide, no reaction occurs, and the platinum is removed chemically using aqua regia, for example. The platinum silicide (16) forms the ohmic contact for the source and drain areas (15), and forms the Schottky gate for the MESFET. A layer of metal for interconnect is added to complete the device.

In another alternative preferred method, self-aligned gate MESFET is shown in the series of drawings in FIGS. 2a through 2f. Beginning with FIG. 2a, there is shown a substrate (20) of p-type semiconductor material, for example, silicon. On this substrate is grown a layer of silicon oxide (21) 100–600 A thick. Next, a layer of polysilicon 22 is deposited, from 1000 to 5000 A in thickness. Another insulator layer (23) is then deposited, such as silicon nitride, from 200 to 1500 A thick. The resulting structure is then masked with a gate pattern, and subjected to a vertical (or anisotropic) etch process. The resulting structure is now as represented by the drawing in FIG. 2b. The next step is a low temperature steam oxidation. The layer of polysilicon is preferably a heavily doped one so that the oxidation rate in a low-temperature oxidation (less than 950° C.) is enhanced over the oxidation rate of lightly doped single crystal silicon. In this case, for a 500 A layer of oxide grown on the silicon substrate, the side wall oxide on the polysilicon would be from 1000–2000 A. In any case, the oxide (24) grown over the substrate should be approximately the same thickness as the oxide (21) underneath the polysilicon (22). The enhanced oxidation rate of the heavily doped polysilicon will cause the oxide on its vertical sides to be quite thick in relation to the oxide on the substrate. After the oxidation, implants are done through the oxide to form n+ source and drain regions (25) in the substrate. The structure now is approximated by the drawing in FIG. 2c.

Figure 2A:
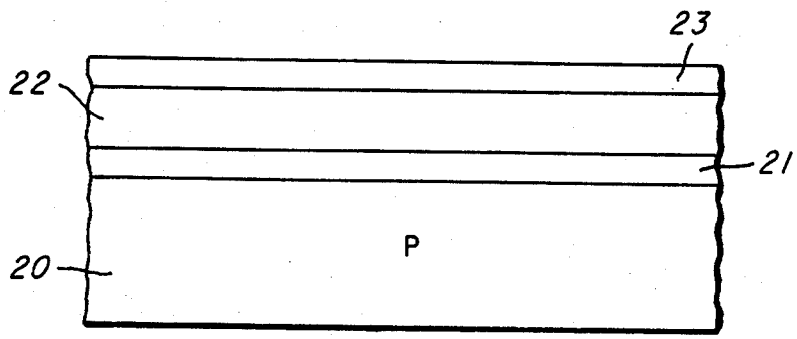
FIG. 2a–f is a series of pictorial cross-sectional views of the structure after steps in the fabrication of a MESFET by an alternative preferred method of the present invention.
Figure 2B:
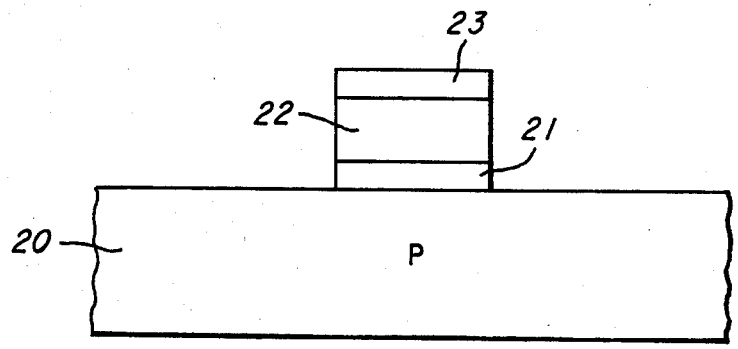
Figure 2C:
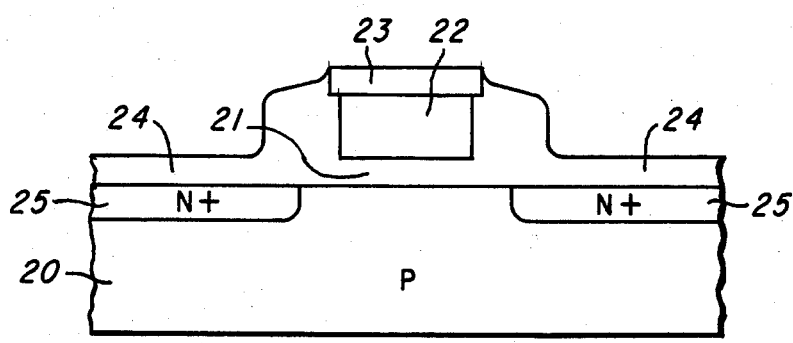
Figure 2D:
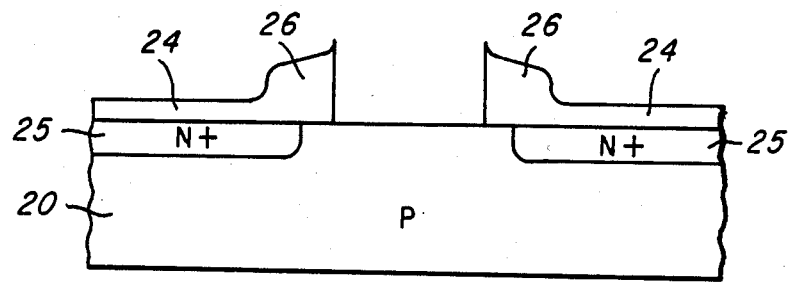
Figure 2E:
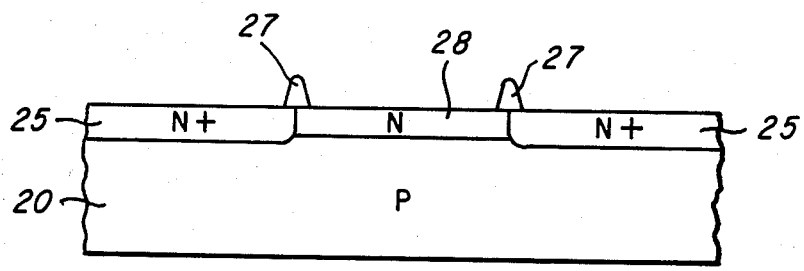
Figure 2F:
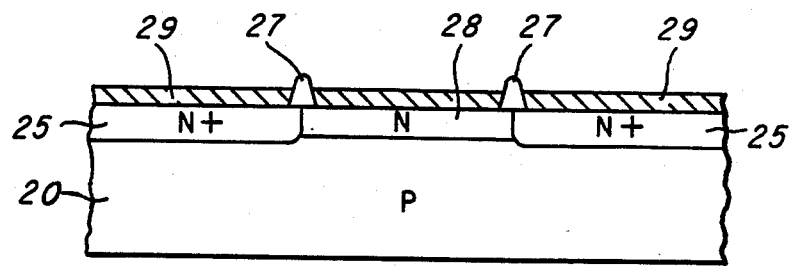

Now, the silicon nitride (23) is selectively etched away using, for example, hot phosphoric acid. Next, the polysilicon is selectively etched away using, for example, CCl$_4$, HCl, N$_2$ plasma or ethylendiamine. The structure then would resemble the depiction in FIG. 2d. The next step may be accomplished by either one of two ways. In one way, an ion implant of a heavy impurity is performed to damage the oxide on the planar surface (24). This would not damage all the oxide of the vertical wall (26), only that on the top. Then, an etchant which preferentially attacks the damaged oxide is used. In another way to remove the oxide, a plasma anisotropic etch process which has a high selectivity of oxide over silicon could be used. This process has a vertical etch rate significantly higher than the lateral etch rate. By using either of these steps, and then implanting an N-type impurity to form a channel (28) for the device, the structure is then as shown in FIG. 2e. Note that the spacing (27) between the gate and source or drain is now very small. The next step is the deposition of a layer of platinum 29 on the surface of the structure and heat-treating with 300°–700° C. to form platinum silicide in the areas where platinum or other metal contacts the silicon substrate. The solid-state reaction between the platinum and silicon forms platinum silicide. In the areas where the platinum contacts the oxide, no reaction occurs and the platinum is removed by an etch in, for example, aqua regia. The essentially complete structure is now as is shown in FIG. 2f. Interconnects are added to complete the device.

The advantages of these methods of fabrication of the MESFET device are many. The most important are the fully self-aligned gate (with respect to source and drain), the low series resistance between the gate and source/drain, and the compactness of the structure while allowing for adequate field regions. Also, the device exhibits low sheet resistance in the source and drain which allows the source/drain to be used as an interconnect, low ohmic contact resistance in the source and drain, and maximum contact area for source and drain. Additionally, in the alternative employing polysilicon, both MOSFETs and MESFETs could be fabricated simultaneously on the same chip by simply masking a gate area from the polysilicon etch where a MOSFET is desired. There approaches one particularly attractive for submicron geometries since it is based on self-aligning concepts for gate, source, drain, metalization, and contacts.

What is claimed is:

1. A method for fabrication of a MESFET device in which the gate is self-aligned in relation to the source/drain regions of said device, comprising the steps of:
   growing a layer of silicon oxide on a silicon substrate of p type conductivity;
   depositing a layer of heavily doped polysilicon over said layer of silicon oxide;
   depositing a layer of insulating material over said polysilicon;
   masking of the area to be the gate region of said device;
   etching anisotropically to remove all material down to said silicon substrate;
   oxidizing the structure in a low temperature steam environment to form an oxide layer on exposed areas of said silicon substrate except in said gate region and said polysilicon;
   implanting N-type impurity through the oxide grown in the previous step and into the substrate to form N+ source and drain regions;
   removing said insulating material over said polysilicon then removing said polysilicon;
   etching the structure with an anisotropic plasma etch;
   implanting an n type impurity in the gate area between the remaining vertical sections of oxide to form an active channel for said MESFET device;
   depositing a layer of metal over the surface of the structure, and heating to convert the metal to metal silicide where the metal is in contact with said silicon substrate;
   etching away metal where not converted to metal silicide.

2. A method as in claim 1, wherein said insulating material is silicon nitride.

* * * * *